US011297702B2

(12) United States Patent
Chang et al.

(10) Patent No.: US 11,297,702 B2
(45) Date of Patent: Apr. 5, 2022

(54) DIMMER INTERFACE CIRCUIT AND BUFFER STAGE CIRCUIT THEREOF

(71) Applicant: Richtek Technology Corporation, Zhubei (TW)

(72) Inventors: Yu-Wen Chang, Nantou (TW); Leng-Nien Hsiu, Hsinchu (TW); Isaac Y. Chen, Hsinchu (TW)

(73) Assignee: RICHTEK TECHNOLOGY CORPORATION, Zhubei (TW)

( * ) Notice: Subject to any disclaimer, the term of this patent is extended or adjusted under 35 U.S.C. 154(b) by 1 day.

(21) Appl. No.: 17/060,055

(22) Filed: Sep. 30, 2020

(65) Prior Publication Data

US 2021/0227659 A1 Jul. 22, 2021

(30) Foreign Application Priority Data

Jan. 16, 2020 (TW) ................................. 109101524

(51) Int. Cl.
*H05B 45/10* (2020.01)
*H05B 45/325* (2020.01)
*H05B 45/37* (2020.01)
*H03K 3/356* (2006.01)

(52) U.S. Cl.
CPC ..... *H05B 45/325* (2020.01); *H03K 3/356017* (2013.01); *H05B 45/10* (2020.01)

(58) Field of Classification Search
CPC ...... H05B 45/10; H05B 45/12; H05B 45/325; H05B 45/37; H05B 45/3725; H05B 45/382; H05B 45/385; H02M 3/335; H02M 3/33507; H02M 3/33553
See application file for complete search history.

(56) References Cited

U.S. PATENT DOCUMENTS

| 10,039,171 | B1* | 7/2018 | Li | H05B 45/14 |
| 2012/0293087 | A1* | 11/2012 | Matsuda | H05B 45/385 |
| | | | | 315/219 |
| 2019/0059134 | A1* | 2/2019 | Lai | H05B 45/397 |
| 2019/0104589 | A1* | 4/2019 | Wang | H05B 45/385 |
| 2019/0159310 | A1* | 5/2019 | Yang | H05B 45/3725 |
| 2020/0060003 | A1* | 2/2020 | Wang | H02M 3/33507 |

* cited by examiner

Primary Examiner — Thai Pham
(74) Attorney, Agent, or Firm — Tung & Associates

(57) ABSTRACT

A dimmer interface circuit includes a buffer stage circuit and a PWM control circuit. The buffer stage circuit converts a dimming input signal to a dimming buffer signal. The buffer stage circuit includes: a power rail generation circuit, which generates a power rail according to the dimming input signal adaptively, so that the dimming input signal is between a high level voltage and a low level voltage of the power rail; and an amplification circuit, which receives the dimming input signal, to generate the dimming buffer signal. The power rail supplies electrical power to the amplification circuit, wherein the amplification circuit operates within a range between the high level voltage and the low level voltage. The PWM control circuit converts the dimming buffer signal to a PWM dimming signal, so as to adjust a brightness of an LED module.

49 Claims, 9 Drawing Sheets

DIMMER INTERFACE CIRCUIT AND BUFFER STAGE CIRCUIT THEREOF

CROSS REFERENCE

The present invention claims priority to TW 109101524 filed on Jan. 16, 2020.

BACKGROUND OF THE INVENTION

Field of Invention

The present invention relates to a dimmer interface circuit; particularly, it relates to a dimmer interface circuit including a buffer stage circuit which is capable of adaptively adjust the power rail. The present invention also relates to a buffer stage circuit for use in such dimmer interface circuit.

Description of Related Art

Please refer to FIG. 1, which shows a schematic diagram of a typical flyback dimming circuit 1. The flyback dimming circuit 1 is configured to operably supply a dimming current ILED to a LED module 16 according to a dimming input signal DIM, so as to adjust a brightness of the LED module 16. Generally, a flyback dimming circuit 1 comprises: a rectifier circuit 11, a transformer 12, a primary side switch 13, a primary side control circuit 14, a dimmer interface circuit 15, a coupler circuit 17 and a current sensing circuit 18. The rectifier circuit 11 rectifies an AC voltage Vac, to generate an input voltage Vin. The rectifier circuit 11 for example can be a bridge rectifier circuit. In the flyback dimming circuit 1, the transformer 12 includes a primary side winding W1 and a secondary side winding W2 coupled to each other via electromagnetic induction. The primary side winding W1 is coupled to the input voltage Vin, to receive the input voltage Vin. The primary side switch 13 is coupled to the primary side winding W1 and is configured to operably control the primary side winding W1, thus controlling an ON period of the primary side winding W1 so as to generate an output voltage Vout between a node N21 and a node N22 (the node N22 is electrically connected to a ground voltage level GND) of the secondary side winding W2, and to supply the dimming current ILED.

The primary side control circuit 14 is at a primary side of the transformer 12 and is configured to operably generate a switching signal GATE according to a coupled PWM dimming signal DIM1 generated by a PWM dimming signal DRV, to operate the primary side switch 13. In addition, the primary side control circuit 14 can generate the switching signal GATE further according to a current sensing signal CS, wherein the current sensing signal CS is generated by sensing a current flowing through the primary side switch 13 via the current sensing circuit 18. Moreover, the primary side control circuit 14 can generate the switching signal GATE further according to a feedback signal related to the output voltage Vout.

The dimmer interface circuit 15 is at a secondary side of the transformer 12 and is configured to operably receive the dimming input signal DIM, to generate the PWM dimming signal DRV. The coupler circuit 17 is coupled between the primary side control circuit 14 and the dimmer interface circuit 15. The coupler circuit 17 is configured to operably convert the PWM dimming signal DRV to the coupled PWM dimming signal DIM1 via a non-contact manner. The coupled PWM dimming signal DIM1 is inputted to the primary side control circuit 14, to control the brightness of the LED module 16. The coupler circuit 17 for example can be an opto-coupler circuit as shown in FIG. 1. For another example, the coupler circuit 17 can be a transformer, as long as a function of non-contact signal transmission can be achieved. An internal supply voltage VCC supplies power to the dimmer interface circuit 15.

Generally, the dimming input signal DIM can be implemented as three different forms. As shown in FIG. 1, the dimming input signal DIM can be implemented as a pulse width modulation (PMW) signal, a voltage level signal or a variable resistor VR. A voltage range of these different forms of the dimming input signal DIM is generally higher than a withstandable voltage range of a typical low voltage electronic device (i.e. the voltage range that the typical low voltage electronic device can withstand). The dimming input signal DIM is usually a signal having a voltage range from 0V to 10V. Generally, the dimmer interface circuit 15 includes a microprogrammed control unit (MCU). To process the dimming input signal DIM having the above-mentioned voltage range from 0V to 10V, it is required for the dimmer interface circuit 15 to have a withstandable voltage range from 0V to 10V. However, if all electronic devices adopted by the dimmer interface circuit 15 need to be capable of withstanding a voltage range from 0V to 10V, the manufacturing cost will be undesirably high.

Note that in the context of the present invention, the term "low voltage" refers to a voltage which is not higher than 5V, whereas, the term "high-voltage" refers to a voltage which is higher than 5V.

FIG. 2 shows a schematic diagram of a conventional dimmer interface circuit 15. The conventional dimmer interface circuit 15 includes a current source Is and a voltage-divider circuit 151. An internal supply voltage VCC can supply a voltage of 10V (or a voltage of any other level, as long as a voltage range of the dimming input signal DIM is covered). The ground voltage level is 0V. The conventional dimmer interface circuit 15 can receive a dimming input signal DIM having a voltage range from 0V to 10V, and the voltage-divider circuit 151 can convert the dimming input signal DIM having a voltage range from 0V to 10V to a dimming input signal DIM' having a lower voltage range from for example 0V to 3V or from 0V to 5V. As a result, it is not necessary for the other electronic devices of the conventional dimmer interface circuit 15 to be capable of withstanding a voltage range from 0V to 10V, to lower the manufacturing cost.

The conventional dimmer interface circuit 15 has many drawbacks. For example, the voltage-divider circuit 151 will cause an unwanted load effect at an input pin for receiving the dimming input signal DIM. Such unwanted load effect will undesirably affect the dimming input signal DIM when the above-mentioned input pin is electrically connected to a variable resistor VR, to distort the relationship between the converted dimming input signal DIM' and the dimming input signal DIM, which is difficult to calibrate, thus resulting in inaccurate dimming. For another example, after the voltage-divider circuit 151 divides the voltage of the dimming input signal DIM, the input level shift effect is enlarged. As compared to the dimming input signal DIM, the converted dimming input signal DIM' has a relatively smaller variation range. When the dimmer interface circuit 15 processes the dimming input signal DIM' having a relatively smaller variation range, the input level shift will occupy a higher percentage in the overall signal, i.e. the bias is amplified, which increases the dimming inaccuracy of the LED module 16. In particular, when the dimming input signal DIM' is inputted to an operational amplifier circuit, because the ratio of the input level shift of an operational amplifier circuit to an input voltage having a voltage range from 0V to 3 or 5V is higher than the ratio of the input level shift of the operational amplifier circuit to an input voltage having a voltage range from 0V to 10V, the error of conventional dimmer interface circuit 15 is enlarged.

As used herein, the primary side of the transformer 12 refers to a side which is at the same side as the primary side winding W1 of the transformer 12. The circuits at the primary side of the transformer 12 are commonly electrically connected to a reference voltage level REF. The secondary side of the transformer 12 refers to a side which is at the same side as the secondary side winding W2 of the transformer 12. The circuits at the secondary side of the transformer 12 are commonly electrically connected to a ground voltage level GND. The coupler circuit 17 is coupled between the primary side and the secondary side.

To overcome the drawbacks in the prior art, the present invention proposes a dimmer interface circuit capable of achieving accurate dimming on the LED module through adopting lower-cost electronic devices. The present invention also relates to a buffer stage circuit for use in such dimmer interface circuit.

SUMMARY OF THE INVENTION

From one perspective, the present invention provides a dimmer interface circuit comprising: a buffer stage circuit, which is configured to operably convert a dimming input signal to a dimming buffer signal, wherein the buffer stage circuit includes: a power rail generation circuit, which is powered by receiving an internal supply voltage with reference to a ground voltage level, wherein the power rail generation circuit is configured to operably and adaptively generate a power rail according to the dimming input signal, the power rail including a high level voltage and a low level voltage, wherein the power rail generation circuit adaptively adjusts the power rail, so that the dimming input signal is between the high level voltage and the low level voltage; and an amplification circuit, which is configured to operably receive the dimming input signal, to generate the dimming buffer signal; wherein the power rail is configured to operably supply electrical power to the amplification circuit, and wherein the amplification circuit operates within a range between the high level voltage and the low level voltage, wherein the high level voltage is not higher than the internal supply voltage, whereas, the low level voltage is not higher than the ground voltage level, wherein a voltage difference between the high level voltage and the low level voltage is a voltage drop of the power rail; and a pulse width modulation (PWM) control circuit which is coupled to the buffer stage circuit and which is configured to operably convert the dimming buffer signal to a PWM dimming signal, so as to adjust a brightness of an LED module.

From another perspective, the present invention provides a buffer stage circuit for use in a dimmer interface circuit, the buffer stage circuit being configured to operably convert a dimming input signal to a dimming buffer signal, wherein the dimming buffer signal is inputted to a PWM control circuit, to generate a PWM dimming signal, so as to adjust a brightness of an LED module; the buffer stage circuit comprising: a power rail generation circuit, which is powered by receiving an internal supply voltage with reference to a ground voltage level, wherein the power rail generation circuit is configured to operably and adaptively generate a power rail according to the dimming input signal, the power rail including a high level voltage and a low level voltage, wherein the power rail generation circuit adaptively adjusts the power rail, so that the dimming input signal is between the high level voltage and the low level voltage; and an amplification circuit, which is configured to operably receive the dimming input signal, to generate the dimming buffer signal; wherein the power rail is configured to operably supply electrical power to the amplification circuit, and wherein the amplification circuit operates within a range between the high level voltage and the low level voltage, wherein the high level voltage is not higher than the internal supply voltage, whereas, the low level voltage is not higher than the ground voltage level, wherein a voltage difference between the high level voltage and the low level voltage is a voltage drop of the power rail.

In one embodiment, a voltage range of the dimming input signal is broader than a withstandable voltage range of the amplification circuit, wherein the voltage drop of the power rail is not greater than the withstandable voltage range.

In one embodiment, the power rail generation circuit includes: a level shift up circuit, which is configured to operably and adaptively level shift up the dimming input signal, to generate the high level voltage, wherein the high level voltage is higher than the dimming input signal by a predetermined level shift up level; and a level shift down circuit, which is configured to operably and adaptively level shift down the dimming input signal, to generate the low level voltage, wherein the low level voltage is lower than the dimming input signal by a predetermined level shift down level.

In one embodiment, the power rail generation circuit further includes: a clamp circuit coupled to the level shift up circuit, wherein when the high level voltage drops to an internal voltage, the clamp circuit is configured to operably clamp the high level voltage to the internal voltage, thus ensuring the high level voltage to be not lower than the internal voltage.

In one embodiment, the power rail generation circuit further includes: a pull down circuit coupled to the level shift down circuit, wherein when the high level voltage or the low level voltage drops to a setting voltage, the pull down circuit is configured to operably pull down the low level voltage to the ground voltage level, thus ensuring the low level voltage to remain at the ground voltage under a situation where the high level voltage or the low level voltage is not higher than the setting voltage.

In one embodiment, the amplification circuit includes an operational amplifier; wherein the high level voltage functions as a positive operation voltage of the operational amplifier, whereas, the low level voltage functions as a negative operation voltage of the operational amplifier; wherein a positive terminal of the operational amplifier receives the dimming input signal, and wherein a negative terminal of the operational amplifier is electrically connected to an output terminal of the operational amplifier, to form a unit gain buffer.

In one embodiment, the level shift up circuit includes: a level shift up current source, which is configured to operably supply a level shift up current; and a level shift up diode group including one or a plurality of diode structures which are forward connected in series, wherein the level shift up diode group has an input terminal, which is configured to operably receive the dimming input signal, and wherein the level shift up current flows through the level shift up diode group from a forward terminal of the level shift up diode group to a backward terminal of the level shift up diode group, to adaptively level shift up the dimming input signal, thus generating the high level voltage.

In one embodiment, the level shift down circuit includes a level shift down Zener diode, which is coupled between the high level voltage and the low level voltage, wherein the level shift down Zener diode is configured to operably ensure the voltage drop of the power rail to remain at a level shift down Zener voltage.

In one embodiment, the diode structure includes a metal oxide semiconductor (MOS) device, wherein a gate of the MOS device is electrically connected to a drain of the MOS device.

In one embodiment, the level shift up diode group includes a level shift up source follower, wherein a gate of the level shift up source follower functions as the input terminal for receiving the dimming input signal.

In one embodiment, the level shift down circuit includes: a level shift down current source, which is configured to operably supply a level shift down current; and a level shift down diode group including one or a plurality of diode structures which are forward connected in series, wherein the level shift down diode group has an input terminal, which is configured to operably receive the dimming input signal, and wherein the level shift down current flows through the level shift down diode group from a forward terminal of the level shift down diode group to a backward terminal of the level shift down diode group, to adaptively level shift down the dimming input signal, thus generating the low level voltage.

In one embodiment, the level shift up circuit includes a level shift up Zener diode, which is coupled between the high level voltage and the low level voltage, wherein the level shift up Zener diode is configured to operably ensure the voltage drop of the power rail to remain at a level shift up Zener voltage.

In one embodiment, the diode structure includes a MOS device, wherein a gate of the MOS device is electrically connected to a drain of the MOS device.

In one embodiment, the level shift down diode group includes a level shift down source follower, wherein a gate of the level shift down source follower functions as the input terminal for receiving the dimming input signal.

In one embodiment, the level shift up circuit includes: a level shift up current source, which is configured to operably supply a level shift up current; a level shift up resistor, which is coupled to the level shift up current source and which is configured to operably receive the level shift up current; and a level shift up source follower coupled to the level shift up resistor, wherein an input terminal of the level shift up source follower is configured to operably receive the dimming input signal, and wherein an output terminal of the level shift up source follower is electrically connected to the level shift up resistor; wherein the level shift up current flows through the level shift up resistor and the level shift up source follower, to adaptively level shift up the dimming input signal, thus generating the high level voltage.

In one embodiment, the level shift down circuit includes a level shift down Zener diode, which is coupled between the high level voltage and the low level voltage, wherein the level shift down Zener diode is configured to operably ensure the voltage drop of the power rail to remain at a level shift down Zener voltage.

In one embodiment, the level shift up diode group further includes a level shift up clamp circuit coupled between the gate and a source of the level shift up source follower, wherein the level shift up clamp circuit is configured to operably ensure that a voltage difference between the gate and the source of the level shift up source follower does not exceed a level shift up clamp voltage.

The objectives, technical details, features, and effects of the present invention will be better understood with regard to the detailed description of the embodiments below, with reference to the attached drawings.

DESCRIPTION OF THE PREFERRED EMBODIMENTS

The drawings as referred to throughout the description of the present invention are for illustration only, to show the interrelations between the circuits and the signal waveforms, but not drawn according to actual scale of circuit sizes and signal amplitudes and frequencies.

Figure 1:
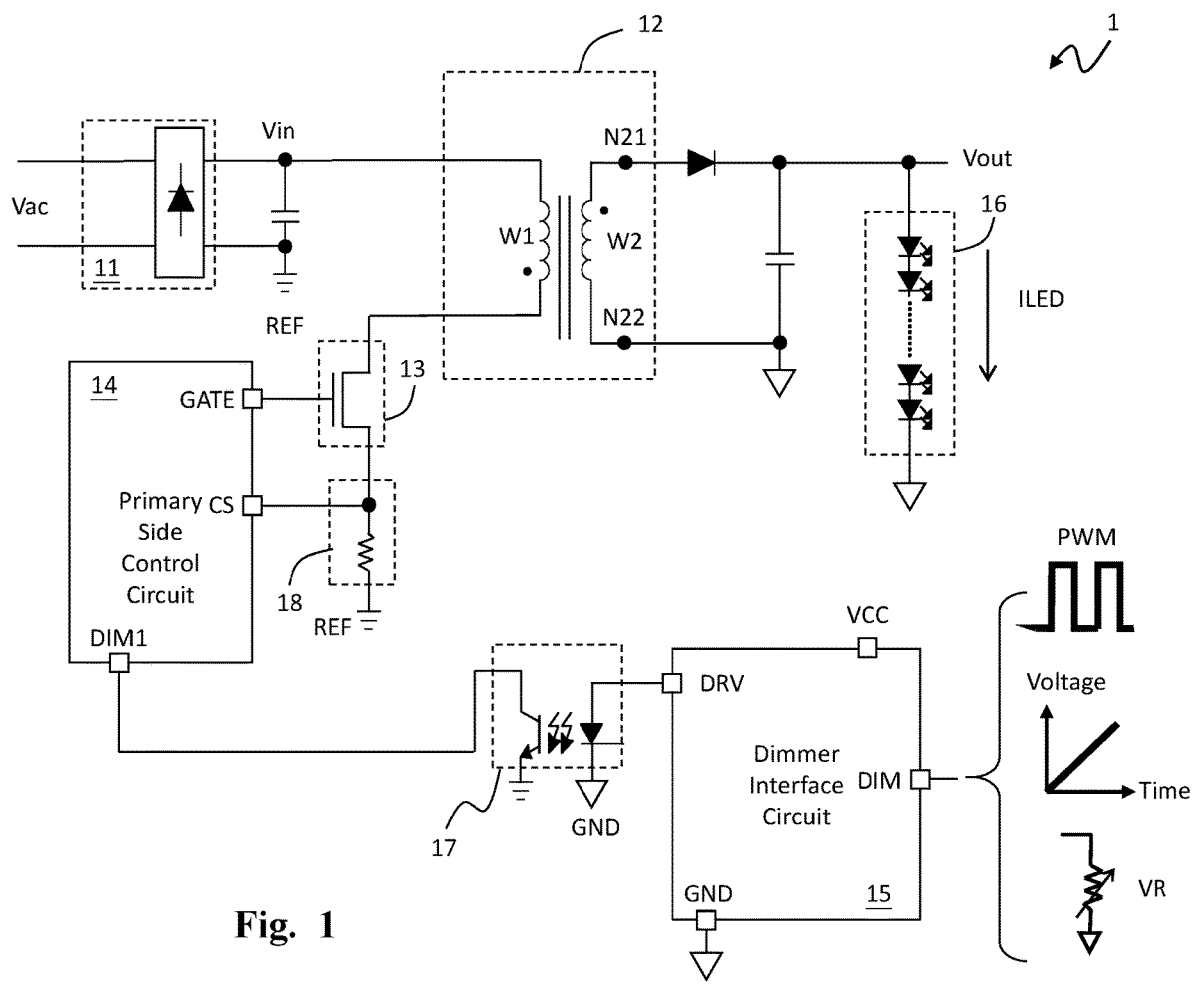
FIG. 1 shows a schematic diagram of a typical flyback dimming circuit 1.
Figure 3A:
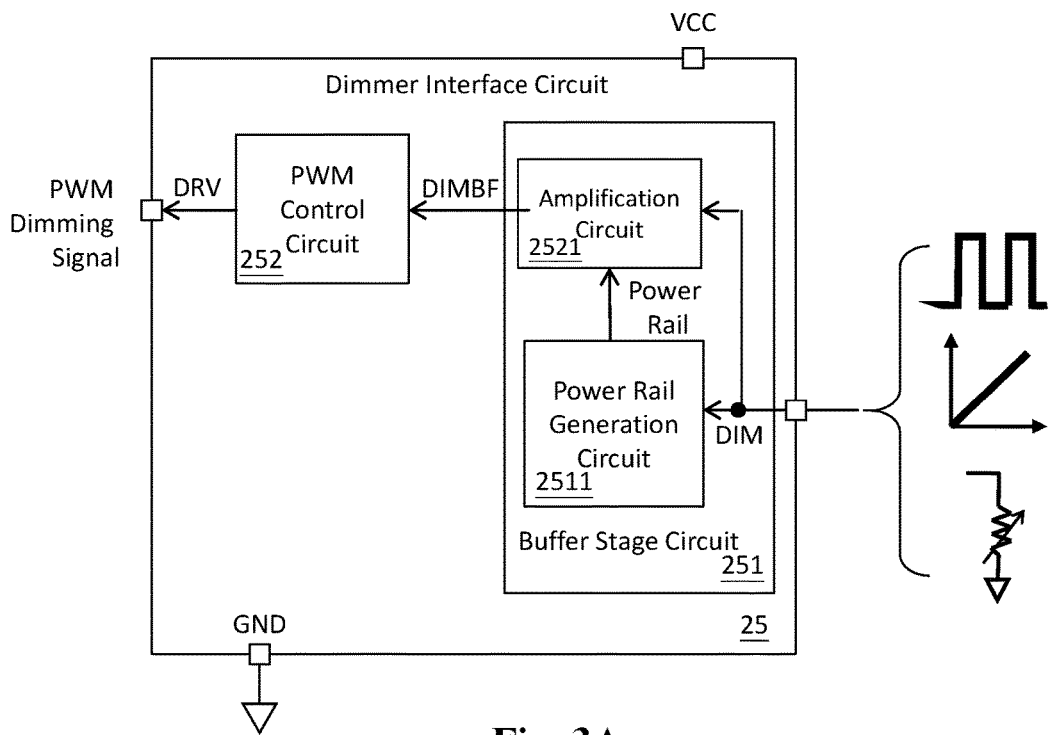
FIGS. 3A-3C show a first embodiment of the present invention.
Figure 3B:
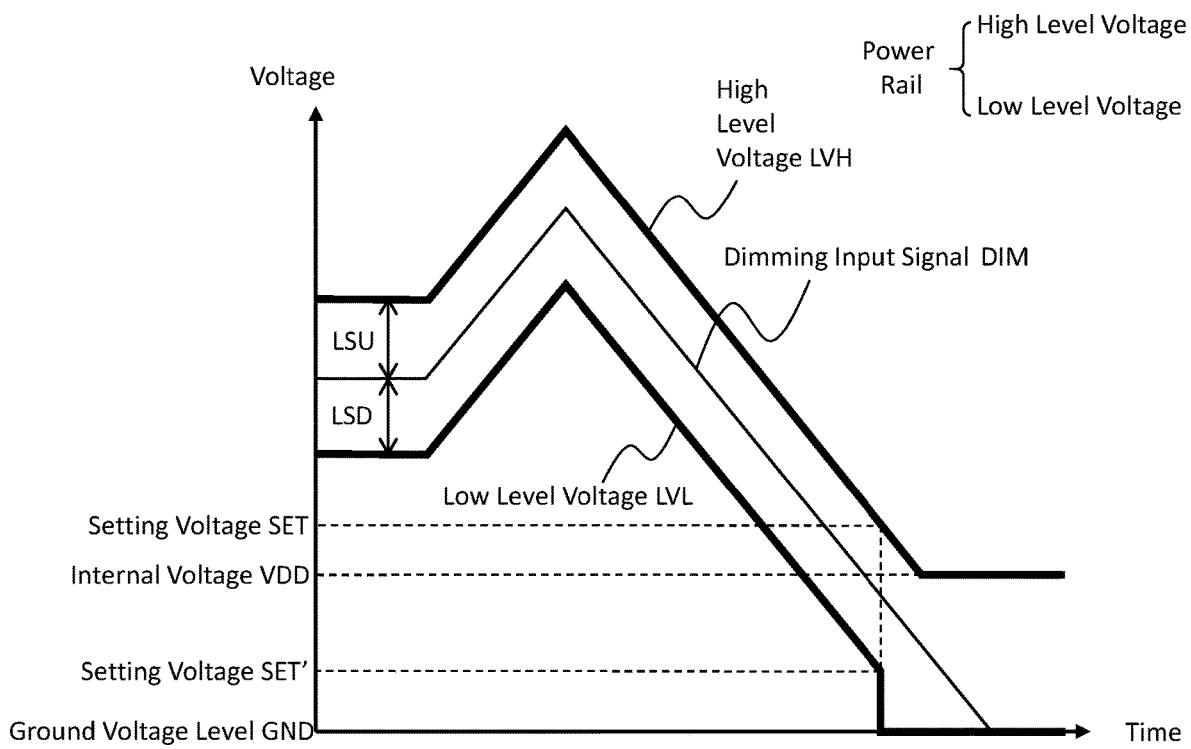
Figure 3C:
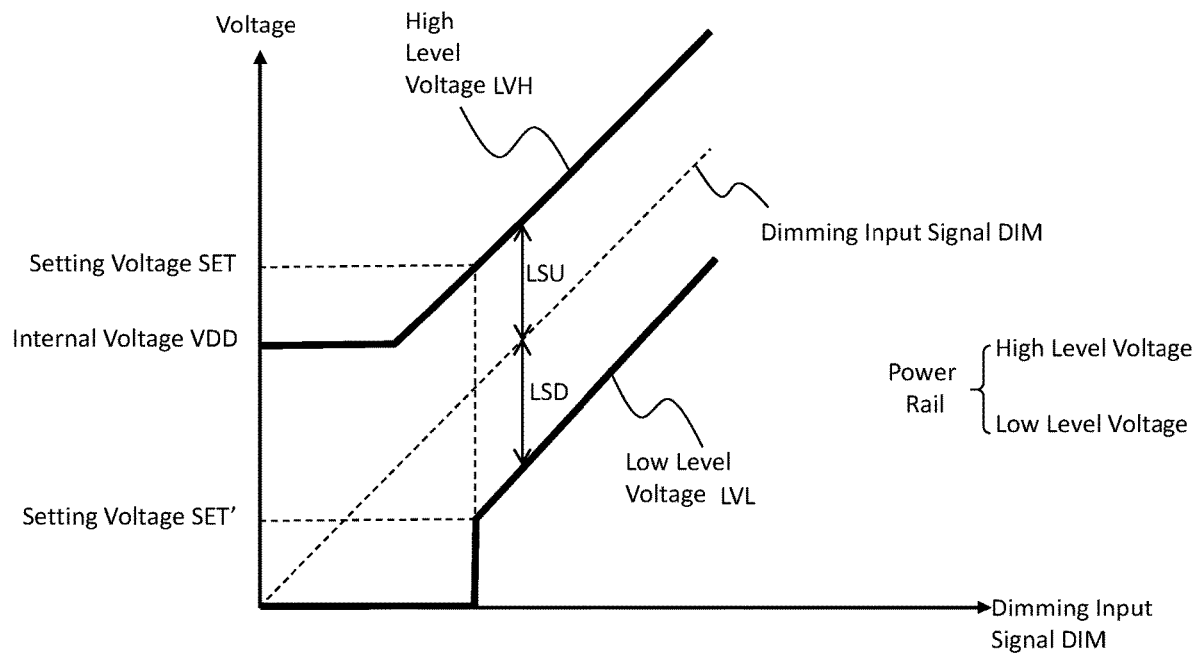

Please refer to FIGS. 3A-3C, which show a first embodiment of the present invention. FIG. 3A shows a schematic diagram of a dimmer interface circuit according to an embodiment of the present invention. FIG. 3B illustrates a schematic diagram of operation waveforms versus time in accordance with a dimmer interface circuit of an embodiment of the present invention. FIG. 3C illustrates a schematic diagram of characteristic curves of a dimming input signal DIM in accordance with a dimmer interface circuit of an embodiment of the present invention. As shown in FIG. 3A, the dimmer interface circuit 25 comprises: a buffer stage circuit 251 and a pulse width modulation (PWM) control circuit 252. An internal supply voltage VCC can supply a voltage of 10V (or a voltage of any other level, as long as a voltage range of the dimming input signal DIM is covered). The ground voltage level is 0V. The buffer stage circuit 251 is configured to operably convert a dimming input signal DIM to a dimming buffer signal DIMBF. The buffer stage circuit 251 includes: a power rail generation circuit 2511 and an amplification circuit 2521. The power rail generation circuit 2511 is configured to operably and adaptively generate a power rail (as shown in FIG. 3B and FIG. 3C) according to the dimming input signal DIM. The power rail has a high level voltage LVH and a low level voltage LVL (as shown by black thick lines in FIG. 3B and FIG. 3C). The power rail generation circuit 2511 adaptively adjusts the power rail according to the dimming input signal DIM. That is, the power rail generation circuit 2511 adaptively adjusts the high level voltage LVH and the low level voltage LVL according to the dimming input signal DIM, so that the dimming input signal DIM is between the high level voltage LVH and the low level voltage LVL. The amplification circuit 2521 is configured to receive the dimming input signal DIM, to operably generate the dimming buffer signal DIMBF. The power rail generated by the power rail generation circuit 2511 supplies electrical power to the amplification circuit 2521. The amplification circuit 2521 operates within a range between the high level voltage LVH and the low level voltage LVL, that is, the high level voltage LVH functions as a positive operation voltage (i.e., power supply voltage) of the amplification circuit 2521, whereas, the low level voltage LVL functions as a negative operation voltage (i.e., ground reference voltage) of the amplification circuit 2521. The PWM control circuit 252 is coupled to the buffer stage circuit 251 and is configured to operably convert the dimming buffer signal DIMBF to a PWM dimming signal DRV. The thus obtained PWM dimming signal DRV is inputted to the primary side control circuit 14 as shown in FIG. 1, to adjust the brightness of the LED module 16.

Figure 2:
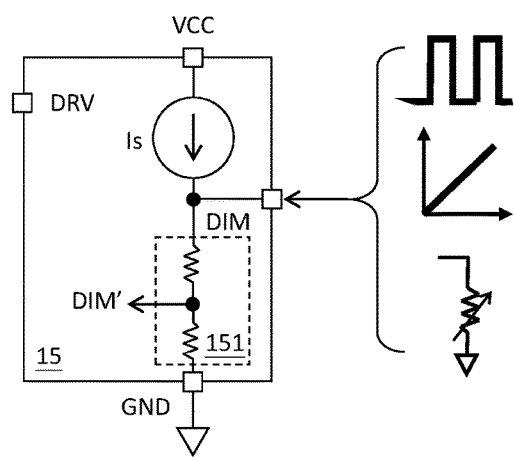
FIG. 2 shows a schematic diagram of a conventional dimmer interface circuit 15.

The present invention is advantageous over prior art in several aspects. For example, the voltage difference between the high level voltage LVH and the low level voltage LVL is the voltage span of the power rail. According to the present invention, in one embodiment, the voltage span of the power rail can be predetermined to not exceed a withstandable voltage range of the amplification circuit 2521. As a result, the amplification circuit 2521 can adopt low voltage (e.g., 5V or 3V) circuit devices instead of high voltage (e.g., 10V or 20V) circuit devices. Generally speaking, on one hand, manufacturing costs for the high voltage circuit devices are high, and on the other hand, the high voltage circuit devices are less accurate in signal processing. The present invention not only can reduce the manufacturing costs but also can improve the accuracy in signal processing. Besides, according to the present invention, in one embodiment, the dimming buffer signal DIM can be directly inputted to the amplification circuit 2521 without being inputted through a voltage divider circuit (as shown by the conventional voltage divider circuit 151 in FIG. 2). Consequently and desirably, the present invention overcomes the issue of level bias due to load effect in the prior art, thus reducing dimming bias. That is, the present invention solves the problem of load effect on the dimming input signal DIM which exists in the prior art dimmer interface circuit 15.

In one embodiment, the voltage range of the dimming input signal DIM is broader than the withstandable voltage range of the amplification circuit 2521, and the present invention is particularly advantageous under such situation. As compared to the prior art, the present invention can adopt an amplification circuit 2521 having a withstandable voltage range which is smaller than the voltage range of the dimming input signal DIM, so that the manufacturing cost of the amplification circuit 2521 is low while the accuracy of the dimming buffer signal DIMBF is high. It is noteworthy that, as one of average skill in the art readily understands, the term "withstandable voltage range" refers to: when a voltage difference between a positive operation voltage and a negative operation voltage of the amplification circuit 2521 is within the "withstandable voltage range", the amplification circuit 2521 can operate normally; however, when a voltage difference between the positive operation voltage and the negative operation voltage of the amplification circuit 2521 is beyond the "withstandable voltage range", the internal devices of the amplification circuit 2521 may operate abnormally due to the over high voltage, or even worse, the devices may be damaged.

Figure 4:
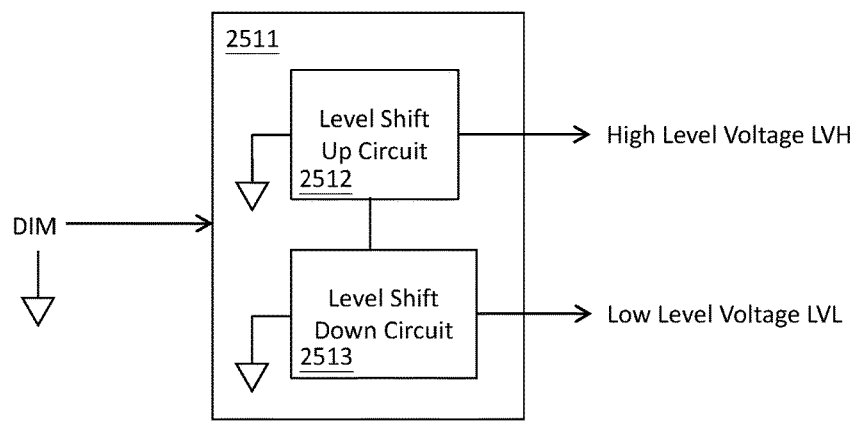
FIG. 4 shows a second embodiment of the present invention.

Please refer to FIGS. 3B-3C along with FIG. 4. FIG. 4 shows a second embodiment of the present invention. This embodiment shows a power rail generation circuit according to an embodiment of the present invention. As shown in FIG. 4, the power rail generation circuit 2511 includes: a level shift up circuit 2512 and a level shift down circuit 2513. The level shift up circuit 2512 is configured to operably and adaptively level shift up the dimming input signal DIM, to generate the high level voltage LVH. The high level voltage LVH is higher than the dimming input signal DIM by a predetermined level shift up level LSU. The level shift down circuit 2513 is configured to operably and adaptively level shift down the dimming input signal DIM, to generate the low level voltage LVL. The low level voltage LVL is lower than the dimming input signal DIM by a predetermined level shift down level LSD.

Because the level shift up circuit 2512 and the level shift down circuit 2513 both receive the dimming input signal DIM and are commonly electrically connected to the ground voltage level GND, it is required for the level shift up circuit 2512 and the level shift down circuit 2513 to adopt a circuit capable of processing the level of the dimming input signal DIM (i.e., a circuit capable of withstanding the high voltage of the dimming input signal DIM). The level shift up circuit 2512 level shifts up the dimming input signal DIM, for example by a predetermined level shift up level LSU, to generate the high level voltage LVH. The level shift down circuit 2513 level shifts down the dimming input signal DIM, for example by a predetermined level shift down level LSD, to generate the low level voltage LVL. It should be understood that the approach for generating the high level voltage LVH and the low level voltage LVL as described in the above-mentioned embodiment is only an illustrative example; in other embodiments, it is also practicable and within the scope of the present invention that the high level voltage LVH and the low level voltage LVL can be generated by other approaches, as long as the high level voltage LVH is higher than the dimming input signal DIM by a predetermined level shift up level LSU and the low level voltage LVL is lower than the dimming input signal DIM by a predetermined level shift down level LSD. Other embodiments as to how the high level voltage LVH and the low level voltage LVL can be generated will be explained later.

Figure 5:
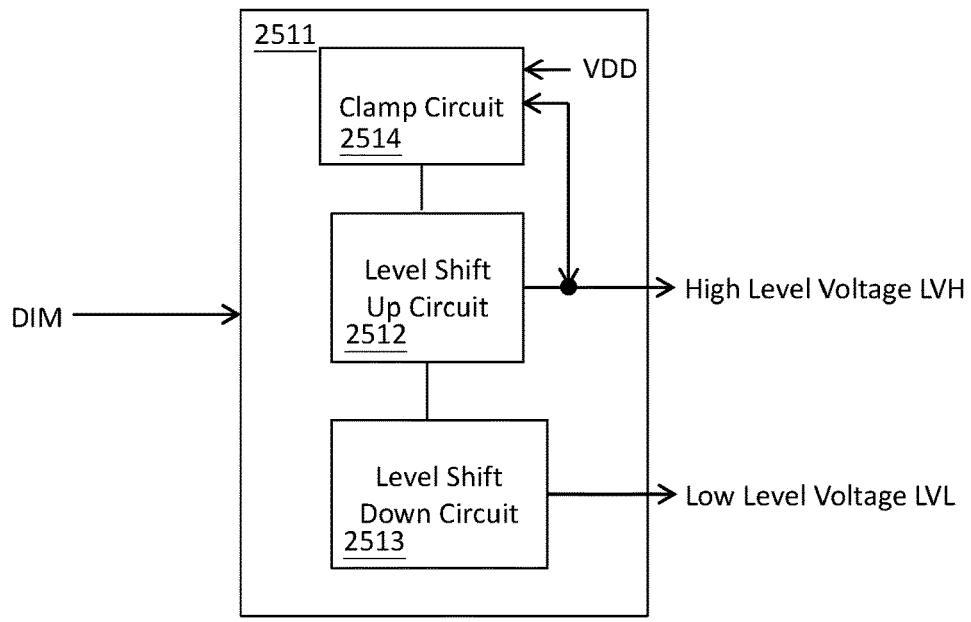
FIG. 5 shows a third embodiment of the present invention.

Please refer to FIGS. 3B-3C along with FIG. 5. FIG. 5 shows a third embodiment of the present invention. This embodiment shows a power rail generation circuit according to another embodiment of the present invention. As shown in FIG. 5, the power rail generation circuit 2511 includes: a level shift up circuit 2512, a level shift down circuit 2513 and a clamp circuit 2514. As compared to the second embodiment, the power rail generation circuit 2511 of this embodiment further includes a clamp circuit 2514. The clamp circuit 2514 is coupled to the level shift up circuit 2512. When the high level voltage LVH drops to an internal voltage VDD, the clamp circuit 2514 is configured to operably clamp the high level voltage LVH to the internal voltage VDD, thus ensuring the high level voltage LVH to be not lower than the internal voltage VDD. The purpose for clamping the high level voltage LVH to the internal voltage VDD is that: because the operation voltage range for an amplification circuit is a predetermined constant (e.g., 0V to 5V), it is required to ensure the voltage drop between the high level voltage LVH and the low level voltage LVL of the power rail to be not lower than a predetermined level, for example but not limited to the above-mentioned 5V. For example, please refer to FIGS. 3B-3C; when the high level voltage LVH drops to the internal voltage VDD, the high level voltage LVH is clamped to the internal voltage VDD by the clamp circuit 2514, so that, even if the dimming input signal DIM keeps dropping, the high level voltage LVH will not be lower than the internal voltage VDD, as shown by FIGS. 3B-3C.

Figure 6:
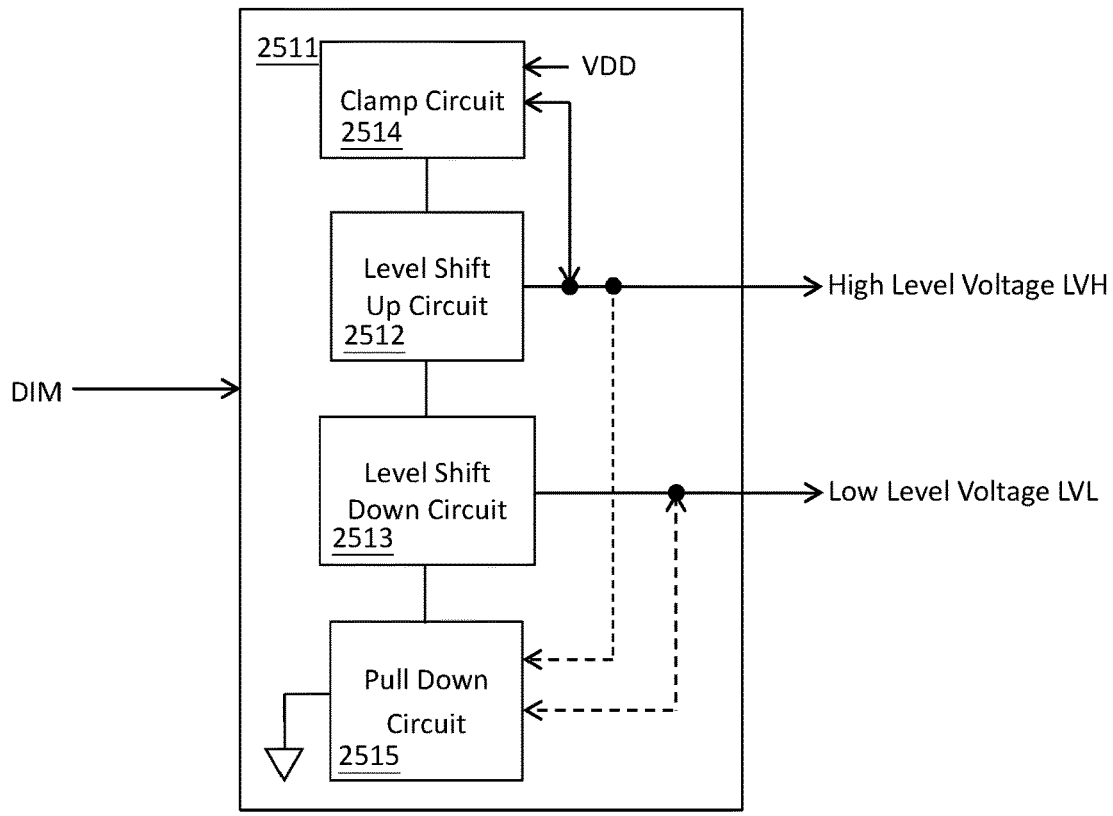
FIG. 6 shows a fourth embodiment of the present invention.

Please refer to FIGS. 3B-3C along with FIG. 6. FIG. 6 shows a fourth embodiment of the present invention. This embodiment shows a power rail generation circuit according to yet another embodiment of the present invention. As shown in FIG. 6, the power rail generation circuit 2511 includes: a level shift up circuit 2512, a level shift down circuit 2513, a clamp circuit 2514 and a pull down circuit 2515. As compared to the third embodiment, the power rail generation circuit 2511 of this embodiment further includes a pull down circuit 2515. The pull down circuit 2515 is coupled to the level shift down circuit 2513. When the high level voltage LVH drops to a setting voltage SET, the pull down circuit 2515 is configured to operably pull down the low level voltage LVL to the ground voltage level GND, thus ensuring the low level voltage LVH to remain at the ground voltage GND under a situation where the high level voltage LVH is not higher than the setting voltage SET. Or, when the low level voltage LVL drops to a setting voltage SET', the pull down circuit 2515 is configured to operably pull down the low level voltage LVL to the ground voltage level GND, thus ensuring the low level voltage LVH to remain at the ground voltage GND under a situation where the low level voltage LVL is not higher than the setting voltage SET'.

The purpose for pulling down the low level voltage LVL to the ground voltage level GND is that: because the predetermined operation voltage range for an amplification circuit is constant and a lowest voltage for an amplification circuit will not be lower than aground voltage level GND, it is required to ensure voltage drop between the high level voltage LVH and the low level voltage LVL of the power rail to be not lower than a predetermined level, for example but not limited to the above-mentioned 5V. For example, please refer to FIGS. 3B-3C; when the high level voltage LVH drops to the setting voltage SET, the low level voltage LVL is pulled down to the ground voltage level GND by the pull down circuit 2515, thus ensuring the low level voltage LVH to remain at the ground voltage GND. Under such situation, even if the dimming input signal DIM and/or the high level voltage LVH keeps dropping, the low level voltage LVH still remains at the ground voltage GND and will not keep dropping, as shown by FIGS. 3B-3C. For another example, please refer to FIGS. 3B-3C. When the low level voltage LVL drops to the setting voltage SET', the low level voltage LVL is pulled down to the ground voltage level GND by the pull down circuit 2515, thus ensuring the low level voltage LVH to remain at the ground voltage GND. Under such situation, even if the dimming input signal DIM keeps dropping, the low level voltage LVH still remains at the ground voltage GND and will not keep dropping, as shown by FIGS. 3B-3C. Certainly, it is not required for the setting voltage SET and the setting voltage SET' to be both applied for example, the setting voltage SET and the setting voltage SET' can be applied on different dimming input signals at different occasions. In one embodiment, the dimming input signal DIM which triggers the pull down circuit 2515 to pull down the low level voltage LVL to the ground voltage level GND is of a level higher than the dimming input signal DIM which triggers the clamp circuit 2514 to clamp the high level voltage LVH to the internal voltage VDD.

Figure 7:
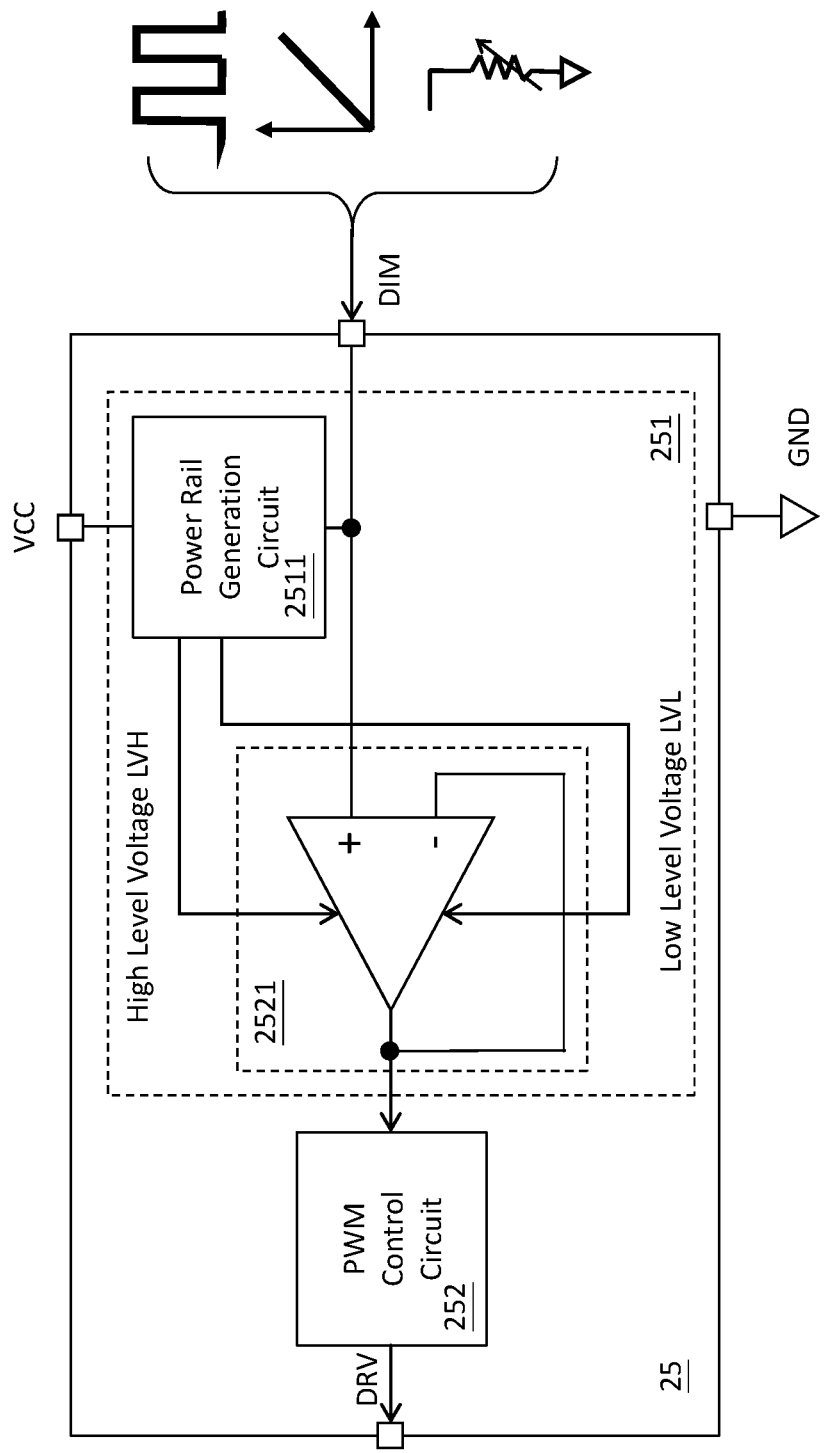
FIG. 7 shows a fifth embodiment of the present invention.

Please refer to FIG. 7, which shows a fifth embodiment of the present invention. This embodiment shows a dimmer interface circuit according to a specific embodiment of the present invention. As shown in FIG. 7, the dimmer interface circuit 25 comprises: a buffer stage circuit 251 and a PWM control circuit 252. The amplification circuit 2521 includes an operational amplifier. The high level voltage LVH functions as a positive operation voltage of the operational amplifier, whereas, the low level voltage LVL functions as a negative operation voltage of the operational amplifier. In this embodiment, a positive terminal of the operational amplifier receives the dimming input signal DIM, and s negative terminal of the operational amplifier is electrically connected to an output terminal of the operational amplifier, to form a unit gain buffer.

It is worthwhile mentioning that, the operational amplifier of this embodiment operates within a range between the high level voltage LVH and the low level voltage LVL, which have a smaller voltage span in between, but the operational amplifier of this embodiment can process a dimming input signal DIM having a larger voltage range. In addition, because the dimming buffer signal DIM can be directly inputted to the operational amplifier (which, ideally, has an infinite input resistance) without being inputted through a voltage divider circuit, the issue of input level shift effect which causes the dimming bias in the prior art is solved. In the operational amplifier, the positive operation voltage and the negative operation voltage supply power to the operational amplifier, which is well known to those skilled in the art, so the details thereof are not redundantly explained here.

Besides, it is worthwhile mentioning that, the amplification circuit 2521 is not limited to be implemented as a unit gain buffer. In other embodiments, it is also practicable and within the scope of the present invention that the amplification circuit 2521 can be implemented as, for example but not limited to, a gain circuit, a summation/subtraction circuit, a differential integration circuit and so on. All of these other types of amplification circuit 2521 can adopt electronic devices which operate by a smaller voltage span between the high level voltage LVH and the low level voltage LVL.

Figure 8:
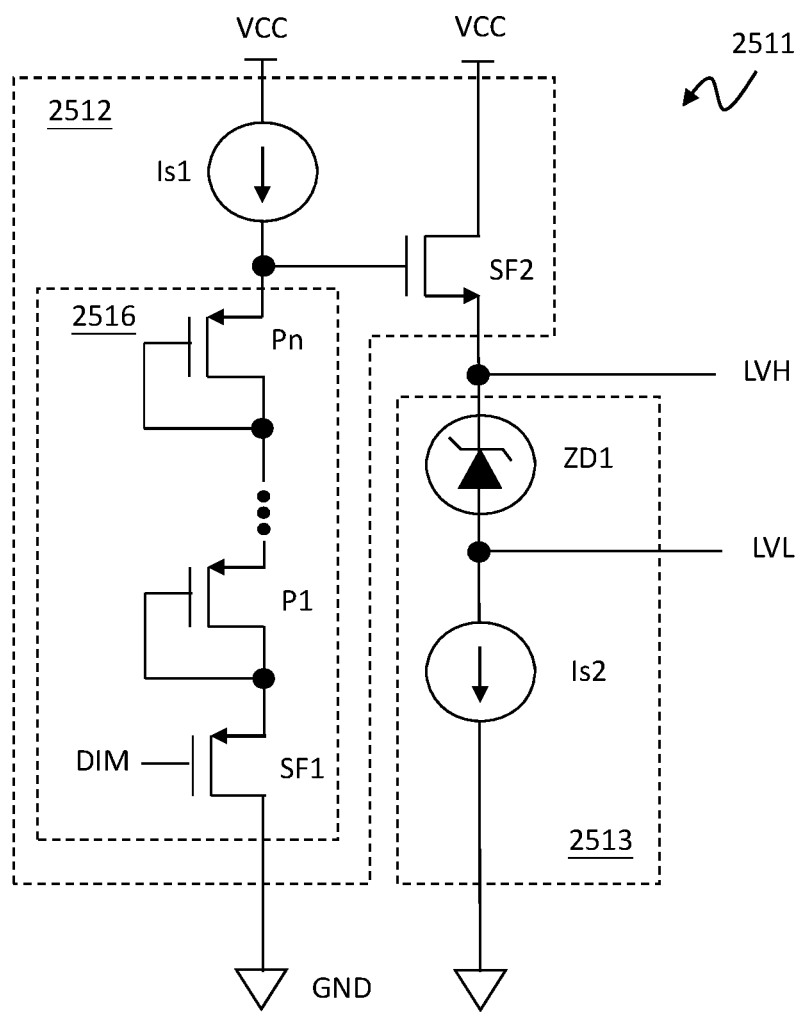
FIG. 8 shows a sixth embodiment of the present invention.

Please refer to FIG. 8, which shows a sixth embodiment of the present invention. This embodiment shows a power rail generation circuit according to a specific embodiment of the present invention. As shown in FIG. 8, the power rail generation circuit 2511 includes: a level shift up circuit 2512 and a level shift down circuit 2513. The level shift up circuit 2512 includes: a level shift up current source Is1, a level shift up diode group 2516 and a level shift up output source follower SF2. The level shift up diode group 2516 includes, in addition to plural diode structures which are forward connected in series, a level shift up source follower SF1. The level shift up current source Is1 is configured to operably supply a level shift up current. In this embodiment, the level shift up current flows for example from an internal supply voltage terminal VCC of the level shift up diode group 2516, through the level shift up diode group 2516, to a ground voltage level terminal GND of the level shift up diode group 2516. The level shift up diode group 2516 includes a level shift up source follower SF1 and plural diode structures which are forward connected in series. In this embodiment, the diode structures which are forward connected in series in the level shift up diode group 2516 can include, for example but not limited to, P-type metal oxide semiconductor (MOS) devices P1 to Pn, wherein a gate of each MOS device P1 to Pn is electrically connected to a drain of that MOS device P1 to Pn, wherein n denotes a positive integer. Certainly, it should be understood that the diode structures implemented as P-type MOS devices in the above-mentioned preferred embodiment are only an illustrative example; in other embodiments, it is also practicable and within the scope of the present invention that the diode structures which are forward connected in series in the level shift up diode group 2516 can include, for example but not limited to, N-type MOS devices.

The level shift up diode group 2516 has a forward terminal (as shown by a source of the top P-type MOS device Pn in FIG. 8). The forward terminal of the level shift up diode group 2516 is coupled to the level shift up current source Is1, to receive the level shift up current. Besides, the level shift up diode group 2516 has a backward terminal (as shown by a drain of the level shift up source follower SF1 in FIG. 8) coupled to the ground voltage level GND. Moreover, the level shift up diode group 2516 has an input terminal (as shown by a gate of the level shift up source follower SF1 in FIG. 8), which is configured to operably receive the dimming input signal DIM. The predetermined level shift up level LSU can be determined by arranging a number (and forward conduction voltage) of the diode structures, a gate-source voltage of the level shift up source follower SF1, and a gate-source voltage of the level shift up output source follower SF2. The level shift up current flows through the level shift up diode group 2516, to adaptively level shift up the dimming input signal DIM. In the level shift up circuit 2512, the level shift up source follower SF1 is connected in series to the level shift up diode group 2516, wherein an input terminal of the level shift up source follower SF1 receives the dimming input signal DIM, whereas, an output terminal thereof (as shown by a source of the level shift up source follower SF1 in FIG. 8) is electrically connected to a drain of the P-type MOS device P1. The level shift up output source follower SF2 is coupled to the level shift up diode group 2516. The level shift up output source follower SF2 is configured to operably generate the high level voltage LVH according to a forward terminal voltage of the level shift up diode group 2516.

It is worthwhile mentioning that, the level shift up diode group 2516 in the level shift up circuit 2512 can be replaced by other type of devices such as a Zener diode(s), as long as this other type of device ca level shift up the dimming input signal DIM by a constant voltage (i.e., the level shift up level LSU), to generate the high level voltage LVH. In the embodiment where the level shift up diode group 2516 is replaced by a Zener diode, the forward-backward connection direction of the Zener diode can be opposite to the forward-backward connection direction of the above-mentioned level shift up diode group 2516, so as to obtain a Zener voltage of the Zener diode.

Please still refer to FIG. 8. The level shift down circuit 2513 includes: a level shift down Zener diode ZD1 and a level shift down current source Is2. The level shift down current source Is2 is configured to operably supply a level shift down current. In this embodiment, the level shift down current flow through the level shift down Zener diode ZD1 from for example a backward terminal of the level shift down Zener diode ZD1 to a forward terminal of the level shift down Zener diode ZD1 and to a ground voltage level terminal GND. The level shift down Zener diode ZD1 is coupled between the high level voltage LVH and the low level voltage LVL. By the characteristic of the level shift down Zener diode ZD1, the level shift down Zener diode ZD1 can ensure the voltage drop between the high level voltage LVH and the low level voltage LVL to remain at a level shift down Zener voltage, which can be, for example but not limited to, a sum of the level shift up level LSU plus the level shift down level LSD.

It is worthwhile mentioning that, the level shift down Zener diode ZD1 in the level shift down circuit 2513 can be replaced by other type of devices such as plural diode structures which are forward connected in series, as long as the voltage drop between the high level voltage LVH and the low level voltage LVL can be kept as a constant voltage difference (i.e., to be a sum of the level shift up level LSU plus the level shift down level LSD).

Figure 9:
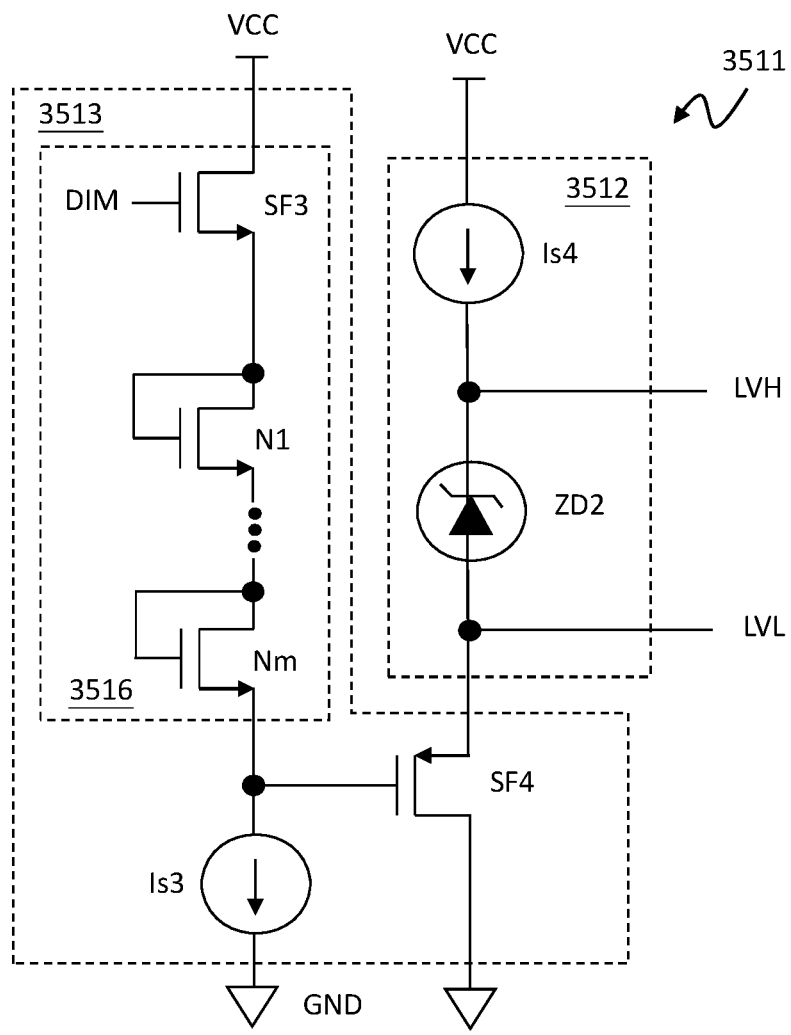
FIG. 9 shows a seventh embodiment of the present invention.

Please refer to FIG. 9, which shows a seventh embodiment of the present invention. This embodiment shows a power rail generation circuit according to a specific embodiment of the present invention. As shown in FIG. 9, the power rail generation circuit 3511 includes: a level shift up circuit 3512 and a level shift down circuit 3513. The level shift down circuit 3513 includes: a level shift down current source Is3, a level shift down diode group 3516 and a level shift down output source follower SF4. The level shift down current source Is3 is configured to operably supply a level shift down current. In this embodiment, the level shift down current flows for example from an internal supply voltage terminal VCC of the level shift down diode group 3516, through the level shift down diode group 3516, to a ground voltage level terminal GND of the level shift down diode group 3516. The level shift down diode group 3516 includes a level shift down source follower SF3 and plural diode structures which are forward connected in series.

In this embodiment, the diode structures which are forward connected in series in the level shift down diode group 3516 can include, for example but not limited to, N-type metal oxide semiconductor (MOS) devices N1 to Nm, wherein a gate of each MOS device N1 to Nm is electrically connected to a drain of that MOS device N1 to Nm, wherein m denotes a positive integer. Certainly, it should be understood that the diode structures implemented as N-type MOS devices in the above-mentioned preferred embodiment are only an illustrative example; in other embodiments, it is also practicable and within the scope of the present invention that the diode structures which are forward connected in series in the level shift down diode group 3516 can include, for example but not limited to, P-type MOS devices. The level shift down diode group 3516 has a backward terminal (as shown by a source of the bottom. N-type MOS device Nm in FIG. 9). The backward terminal of the level shift down diode group 3516 is coupled to the level shift down current source Is3, to receive the level shift down current. Besides, the level shift down diode group 3516 has a forward terminal (as shown by a drain of the level shift down source follower SF3 in FIG. 9) coupled to the internal supply voltage VCC. The level shift down diode group 3516 has an input terminal (as shown by a gate of the level shift down source follower SF3 in FIG. 9), which is configured to operably receive the dimming input signal DIM.

The predetermined level shift down level LSD can be determined through arranging a number (and forward conduction voltages) of the diode structures, a gate-source voltage of the level shift down source follower SF3, and a gate-source voltage of the level shift down output source follower SF4. The level shift down current flows through the level shift down diode group 3516, to adaptively level shift down the dimming input signal DIM. The level shift down diode group 3516 includes a level shift down source follower SF3 coupled to plural diode structures which are forward connected in series. An input terminal of the level shift down source follower SF3 receives the dimming input signal DIM. The level shift down output source follower SF4 is coupled to the level shift down diode group 3516. The level shift down output source follower SF4 is configured to operably generate the low level voltage LVL according to a backward terminal voltage of the level shift down diode group 3516.

Please still refer to FIG. 9. The level shift up circuit 3512 includes: a level shift up Zener diode ZD2 and a level shift up current source Is4. The level shift up current source Is4 is configured to operably supply a level shift up current. In this embodiment, the level shift up current flows for example from a backward terminal of the level shift up Zener diode ZD2, through the level shift up Zener diode ZD2, to a ground voltage level terminal GND. The level shift up Zener diode ZD2 is coupled between the high level voltage LVH and the low level voltage LVL. By the characteristic of the level shift up Zener diode ZD2, the level shift up Zener diode ZD2 keeps the voltage drop between the high level voltage LVH and the low level voltage LVL at a level shift up Zener voltage, which can be, for example but not limited to, a sum of the level shift up level LSU plus the level shift down level LSD.

Figure 10:
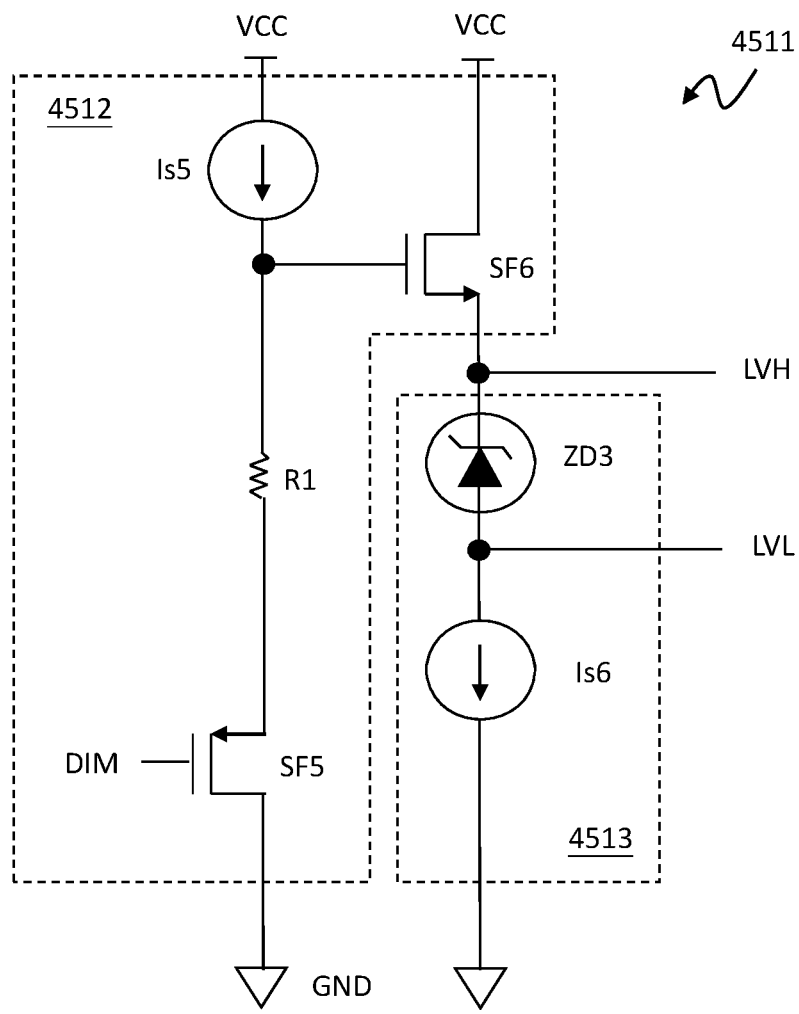
FIG. 10 shows an eighth embodiment of the present invention.

Please refer to FIG. 10, which shows an eighth embodiment of the present invention. This embodiment shows a power rail generation circuit according to a specific embodiment of the present invention. As shown in FIG. 10, the power rail generation circuit 4511 includes: a level shift up circuit 4512 and a level shift down circuit 4513. The level shift up circuit 4512 includes: a level shift up current source Is5, a level shift up resistor R1, a level shift up source follower SF5 and a level shift up output source follower SF6. The level shift up current source Is5 is configured to operably supply a level shift up current. In this embodiment, the level shift up current flows for example from an internal supply voltage terminal VCC, through the level shift up resistor R1 and the level shift up source follower SF5, to a ground voltage level terminal GND. In this embodiment, the level shift up resistor R1 is coupled to the level shift up current source Is5 to receive the level shift up current. The level shift up level LSU can be determined through setting the level shift up current, the level shift up resistor R1, a gate-source voltage of the level shift up source follower SF5 and a gate-source voltage of the level shift up output source follower SF6. The level shift up current flows through the level shift up resistor R1 and the level shift up source follower SF5, to adaptively level shift up the dimming input signal DIM. The level shift up source follower SF5 of the level shift up circuit 4512 is coupled to the level shift up resistor R1, wherein an input terminal of the level shift up source follower SF5 receives the dimming input signal DIM, whereas an output terminal thereof (as shown by a source of the level shift up source follower SF5) is electrically connected to the level shift up resistor R1. The level shift up output source follower SF6 is coupled to the level shift up resistor R1. The level shift up output source follower SF6 is configured to operably generate the high level voltage LVH according to a voltage of an end of the level shift up resistor R1 which is electrically connected to the level shift up current source Is5.

Please still refer to FIG. 10. The level shift down circuit 4513 includes: a level shift down Zener diode ZD3 and a level shift down current source Is6. The level shift down current source Is6 is configured to operably supply a level shift down current. In this embodiment, the level shift down current flows for example from a backward terminal of the level shift down Zener diode ZD3, through the level shift down Zener diode ZD3, to the ground voltage level terminal GND. By the characteristic of the Zener diode, the Zener diode keeps the voltage drop between the high level voltage LVH and the low level voltage LVL at a level shift down Zener voltage, which can be, for example but not limited to, a sum of the level shift up level LSU plus the level shift down level LSD.

Figure 11:
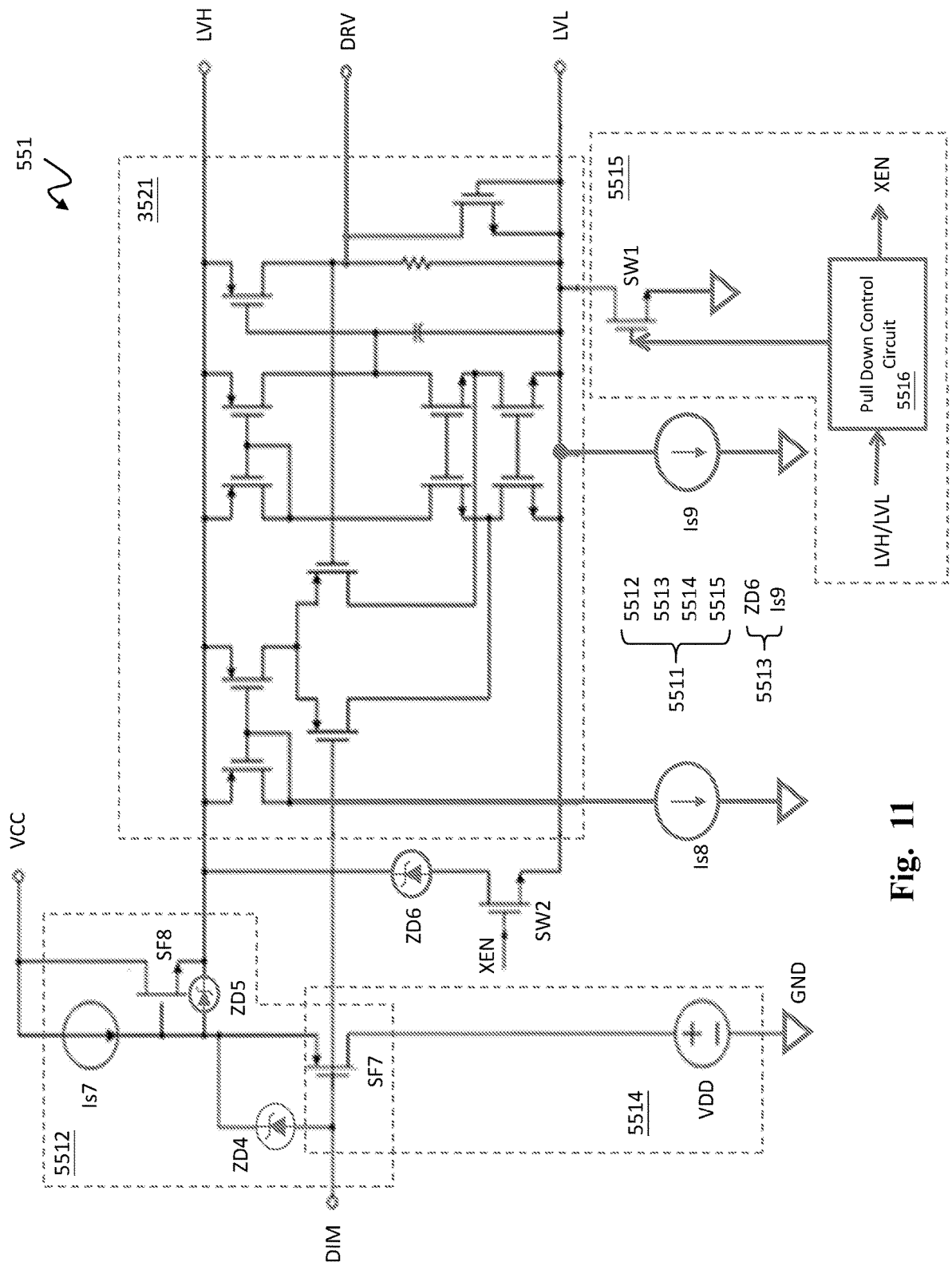
FIG. 11 shows a ninth embodiment of the present invention.

Please refer to FIG. 11, which shows a ninth embodiment of the present invention. This embodiment shows a buffer stage circuit according to a specific embodiment of the present invention. As shown in FIG. 11, the buffer stage circuit 551 includes: a power rail generation circuit 5511 and an amplification circuit 3521. The amplification circuit 3521 can be implemented as an operational amplifier as shown in FIG. 11. It should be understood that the arrangement of the internal circuits in the operational amplifier as shown in FIG. 11 is only an illustrative example; operational amplifier is well known to those skilled in the art, and the internal circuits in the operational amplifier can be implemented by those skilled in this art according to the teaching of the present invention and the needs in practical applications, so the details for the arrangement of the internal circuits and operation of the operational amplifier are not redundantly explained here. It is worthwhile noting that, in this embodiment, the amplification circuit 3521 (i.e., the operational amplifier) operates within a range between the high level voltage LVH and the low level voltage LVL; the relevant peripheral circuit (e.g., the current source Is8) outside the amplification circuit 3521 is configured to operably supply current to the amplification circuit 3521, but is not apart of the amplification circuit 3521.

The power rail generation circuit 5511 includes: a level shift up circuit 5512, a level shift down circuit 5513, a clamp circuit 5514 and a pull down circuit 5515. The level shift up circuit 5512 includes: a level shift up current source Is7; a level shift up source follower SF7 and a level shift up output source follower SF8, the level shift up source follower SF7 and the level shift up output source follower SF8 functioning as a level shift up diode group; a Zener diode ZD4, functioning as a level shift up clamp circuit; and a Zener diode ZD5, functioning as a level shift up output clamp circuit. The level shift up current source Is7 is configured to operably supply a level shift up current. In this embodiment, the level shift up current flows for example from an internal supply voltage terminal VCC, through the level shift up source follower SF7 and the clamp circuit 5514, to a ground voltage level terminal GND.

In the level shift up circuit 5512, the level shift up source follower SF7 has an input terminal (as shown by a gate of the level shift up source follower SF7 in FIG. 11), which is configured to operably receive the dimming input signal DIM. The level shift up level LSU can be determined according to a gate-source voltage of the level shift up source follower SF7 and a gate-source voltage of a depletion N-type level shift up output source follower SF8, so as to generate the high level voltage LVH. The level shift up output source follower SF8 is coupled to the level shift up source follower SF7, to level shift up the dimming input signal DIM by a predetermined level shift up level LSU, for generating the high level voltage LVH.

It is worthwhile noting that, the Zener diode ZD4 functions as a level shift up clamp circuit and is coupled between a gate and a source of the level shift up source follower SF7. The Zener diode ZD4 is configured to operably supply a level shift up clamp voltage, to ensure that a voltage difference between the gate and the source of the level shift up source follower SF7 does not exceed the level shift up clamp voltage, thus improving a transient state effect of the level shift up source follower SF7.

It is worthwhile noting that, the Zener diode ZD5 functions as a level shift up output clamp circuit and is coupled between a gate and a source of the level shift up output source follower SF8. The Zener diode ZD5 is configured to operably supply a level shift up output clamp voltage, to ensure that a voltage difference between the gate and the source of the level shift up output source follower SF8 does not exceed the level shift up output clamp voltage, thus improving a transient state effect of the level shift up output source follower SF8.

Please still refer to FIG. 11. The level shift down circuit 5513 includes: a level shift down Zener diode ZD6 and a level shift down current source Is9. The level shift down current source Is9 is configured to operably supply a level shift down current. In this embodiment, the level shift down current flows for example from a backward terminal of the level shift down Zener diode ZD6, through the level shift down Zener diode ZD6, to a forward terminal of the level shift down Zener diode ZD6 and to a ground voltage level terminal GND. The level shift down Zener diode ZD6 is coupled between the high level voltage LVH and the low level voltage LVL. By the characteristic (i.e., Zener breakdown voltage) of the Zener diode, the level shift down Zener diode ZD6 is configured to operably keep the voltage drop between the high level voltage LVH and the low level voltage LVL at a level shift down Zener voltage, which can be, for example but not limited to, a sum of the level shift up level LSU plus the level shift down level LSD.

Please still refer to FIG. 11. The clamp circuit 5514 is coupled to the level shift up circuit 5512. As shown in FIG. 11, when the high level voltage LVH drops to an internal voltage VDD, the clamp circuit 5514 is configured to operably clamp the high level voltage LVH to the internal voltage VDD, thus ensuring the high level voltage LVH to be not lower than the internal voltage VDD. In other words, a voltage source and the level shift up source follower SF7 as shown in FIG. 11 function as a clamp circuit 5514, to ensure the high level voltage LVH to be not lower than the internal voltage VDD.

Please still refer to FIG. 11. In this embodiment, the pull down circuit 5515 includes: a pull down control circuit 5516, a pull down switch SW1 and a level shift down switch SW2. The pull down control circuit 5516 is configured to operably receive the high level voltage LVH or the low level voltage LVL. When the high level voltage LVH drops to the setting voltage SET or when the low level voltage LVL drops to the setting voltage SET', the pull down switch SW1 is turned ON, causing the low level voltage LVL to be electrically connected to the ground voltage level GND. As a result, the low level voltage LVL is pulled down to the ground voltage level GND. Therefore, when the high level voltage LVH is not higher than a setting voltage SET or when the low level voltage LVL is not higher than a setting voltage SET', the low level voltage LVH is ensured to remain at the ground voltage GND.

In addition to turning ON the pull down switch SW1 when the high level voltage LVH drops to a setting voltage SET or when the low level voltage LVL is reduced to a setting voltage SET', the pull down control circuit 5516 is configured to operably generate a break-off level shift down signal XEN, to turn OFF a level shift down switch SW2 which is connected in series to the level shift down Zener diode ZD6, so that the voltage drop between the high level voltage LVH and the low level voltage LVL no longer remains at the level shift down Zener voltage; thus, when the low level voltage LVL is pulled down to the ground voltage level GND, the high level voltage LVH still can be adaptively adjusted according to the dimming input signal DIM.

The present invention has been described in considerable detail with reference to certain preferred embodiments thereof. It should be understood that the description is for illustrative purpose, not for limiting the scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. For example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. In view of the foregoing, the spirit of the present invention should cover all such and other modifications and variations, which should be interpreted to fall within the scope of the following claims and their equivalents.

What is claimed is:
1. A dimmer interface circuit comprising:
a buffer stage circuit, which is configured to operably convert a dimming input signal to a dimming buffer signal, wherein the buffer stage circuit includes:
a power rail generation circuit, which is powered by receiving an internal supply voltage with reference to a ground voltage level, wherein the power rail generation circuit is configured to operably and adaptively generate a power rail according to the dimming input signal, the power rail including a high level voltage and a low level voltage, wherein the power rail generation circuit adaptively adjusts the power rail, so that the dimming input signal is between the high level voltage and the low level voltage; and
an amplification circuit, which is configured to operably receive the dimming input signal, to generate the dimming buffer signal;
wherein the power rail is configured to operably supply electrical power to the amplification circuit, and wherein the amplification circuit operates within a range between the high level voltage and the low level voltage, wherein the high level voltage is not higher than the internal supply voltage, whereas, the low level voltage is not higher than the ground voltage level, wherein a voltage difference between the high level voltage and the low level voltage is a voltage drop of the power rail; and
a pulse width modulation (PWM) control circuit which is coupled to the buffer stage circuit and which is configured to operably convert the dimming buffer signal to a PWM dimming signal, so as to adjust a brightness of an LED module.
2. The dimmer interface circuit of claim 1, wherein a voltage range of the dimming input signal is broader than a withstandable voltage range of the amplification circuit, and wherein the voltage drop of the power rail is not greater than the withstandable voltage range.

3. The dimmer interface circuit of claim 1, wherein the power rail generation circuit includes:
a level shift up circuit, which is configured to operably and adaptively level shift up the dimming input signal, to generate the high level voltage, wherein the high level voltage is higher than the dimming input signal by a predetermined level shift up level; and
a level shift down circuit, which is configured to operably and adaptively level shift down the dimming input signal, to generate the low level voltage, wherein the low level voltage is lower than the dimming input signal by a predetermined level shift down level.

4. The dimmer interface circuit of claim 3, wherein the power rail generation circuit further includes:
a clamp circuit coupled to the level shift up circuit, wherein when the high level voltage drops to an internal voltage, the clamp circuit is configured to operably clamp the high level voltage to the internal voltage, thus ensuring the high level voltage to be not lower than the internal voltage.

5. The dimmer interface circuit of claim 3, wherein the power rail generation circuit further includes:
a pull down circuit coupled to the level shift down circuit, wherein when the high level voltage or the low level voltage drops to a setting voltage, the pull down circuit is configured to operably pull down the low level voltage to the ground voltage level, thus ensuring the low level voltage to remain at the ground voltage under a situation where the high level voltage or the low level voltage is not higher than the setting voltage.

6. The dimmer interface circuit of claim 1, wherein the amplification circuit includes an operational amplifier;
wherein the high level voltage functions as a positive operation voltage of the operational amplifier, whereas, the low level voltage functions as a negative operation voltage of the operational amplifier;
wherein a positive terminal of the operational amplifier receives the dimming input signal, and wherein a negative terminal of the operational amplifier is electrically connected to an output terminal of the operational amplifier, to form a unit gain buffer.

7. The dimmer interface circuit of claim 3, wherein the level shift up circuit includes:
a level shift up current source, which is configured to operably supply a level shift up current; and
a level shift up diode group including one or a plurality of diode structures which are forward connected in series, wherein the level shift up diode group has an input terminal, which is configured to operably receive the dimming input signal, and wherein the level shift up current flows from a forward terminal of the level shift up diode group, through the level shift up diode group, to a backward terminal of the level shift up diode group, to adaptively level shift up the dimming input signal, thus generating the high level voltage.

8. The dimmer interface circuit of claim 7, wherein the level shift down circuit includes a level shift down Zener diode, which is coupled between the high level voltage and the low level voltage, wherein the level shift down Zener diode is configured to operably ensure the voltage drop of the power rail to remain at a level shift down Zener voltage.

9. The dimmer interface circuit of claim 7, wherein the diode structure includes a metal oxide semiconductor (MOS) device, wherein a gate of the MOS device is electrically connected to a drain of the MOS device.

10. The dimmer interface circuit of claim 7, wherein the level shift up diode group includes a level shift up source follower, wherein a gate of the level shift up source follower functions as the input terminal for receiving the dimming input signal.

11. The dimmer interface circuit of claim 3, wherein the level shift down circuit includes:
a level shift down current source, which is configured to operably supply a level shift down current; and
a level shift down diode group including one or a plurality of diode structures which are forward connected in series, wherein the level shift down diode group has an input terminal, which is configured to operably receive the dimming input signal, and wherein the level shift down current flows from a forward terminal of the level shift down diode group, through the level shift down diode group, to a backward terminal of the level shift down diode group, to adaptively level shift down the dimming input signal, thus generating the low level voltage.

12. The dimmer interface circuit of claim 6, wherein the level shift down circuit includes:
a level shift down current source, which is configured to operably supply a level shift down current; and
a level shift down diode group including one or a plurality of diode structures which are forward connected in series, wherein the level shift down diode group has an input terminal, which is configured to operably receive the dimming input signal, and wherein the level shift down current flows from a forward terminal of the level shift down diode group, through the level shift down diode group, to a backward terminal of the level shift down diode group, to adaptively level shift down the dimming input signal, thus generating the low level voltage.

13. The dimmer interface circuit of claim 11, wherein the level shift up circuit includes a level shift up Zener diode, which is coupled between the high level voltage and the low level voltage, wherein the level shift up Zener diode is configured to operably ensure the voltage drop of the power rail to remain at a level shift up Zener voltage.

14. The dimmer interface circuit of claim 12, wherein the level shift up circuit includes a level shift up Zener diode, which is coupled between the high level voltage and the low level voltage, wherein the level shift up Zener diode is configured to operably ensure the voltage drop of the power rail to remain at a level shift up Zener voltage.

15. The dimmer interface circuit of claim 11, wherein the diode structure includes a MOS device, wherein a gate of the MOS device is electrically connected to a drain of the MOS device.

16. The dimmer interface circuit of claim 12, wherein the diode structure includes a MOS device, wherein a gate of the MOS device is electrically connected to a drain of the MOS device.

17. The dimmer interface circuit of claim 11, wherein the level shift down diode group includes a level shift down source follower, wherein a gate of the level shift down source follower functions as the input terminal for receiving the dimming input signal.

18. The dimmer interface circuit of claim 12, wherein the level shift down diode group includes a level shift down source follower, wherein a gate of the level shift down source follower functions as the input terminal for receiving the dimming input signal.

19. The dimmer interface circuit of claim 3, wherein the level shift up circuit includes:

a level shift up current source, which is configured to operably supply a level shift up current;

a level shift up resistor, which is coupled to the level shift up current source and which is configured to operably receive the level shift up current; and a level shift up source follower coupled to the level shift up resistor, wherein an input terminal of the level shift up source follower is configured to operably receive the dimming input signal, and wherein an output terminal of the level shift up source follower is electrically connected to the level shift up resistor;

wherein the level shift up current flows through the level shift up resistor and the level shift up source follower, to adaptively level shift up the dimming input signal, thus generating the high level voltage.

20. The dimmer interface circuit of claim 6, wherein the level shift up circuit includes:

a level shift up current source, which is configured to operably supply a level shift up current;

a level shift up resistor, which is coupled to the level shift up current source and which is configured to operably receive the level shift up current; and a level shift up source follower coupled to the level shift up resistor, wherein an input terminal of the level shift up source follower is configured to operably receive the dimming input signal, and wherein an output terminal of the level shift up source follower is electrically connected to the level shift up resistor;

wherein the level shift up current flows through the level shift up resistor and the level shift up source follower, to adaptively level shift up the dimming input signal, thus generating the high level voltage.

21. The dimmer interface circuit of claim 19, wherein the level shift down circuit includes a level shift down Zener diode, which is coupled between the high level voltage and the low level voltage, wherein the level shift down Zener diode is configured to operably ensure the voltage drop of the power rail to remain at a level shift down Zener voltage.

22. The dimmer interface circuit of claim 20, wherein the level shift down circuit includes a level shift down Zener diode, which is coupled between the high level voltage and the low level voltage, wherein the level shift down Zener diode is configured to operably ensure the voltage drop of the power rail to remain at a level shift down Zener voltage.

23. The dimmer interface circuit of claim 11, wherein the level shift up diode group further includes a level shift up clamp circuit coupled between the gate and a source of the level shift up source follower, wherein the level shift up clamp circuit is configured to operably ensure that a voltage difference between the gate and the source of the level shift up source follower does not exceed a level shift up clamp voltage.

24. The dimmer interface circuit of claim 19, wherein the level shift up diode group further includes a level shift up clamp circuit coupled between the gate and a source of the level shift up source follower, wherein the level shift up clamp circuit is configured to operably ensure that a voltage difference between the gate and the source of the level shift up source follower does not exceed a level shift up clamp voltage.

25. A buffer stage circuit for use in a dimmer interface circuit, the buffer stage circuit being configured to operably convert a dimming input signal to a dimming buffer signal, wherein the dimming buffer signal is inputted to a PWM control circuit, to generate a PWM dimming signal, so as to adjust a brightness of an LED module; the buffer stage circuit comprising:

a power rail generation circuit, which is powered by receiving an internal supply voltage with reference to a ground voltage level, wherein the power rail generation circuit is configured to operably and adaptively generate a power rail according to the dimming input signal, the power rail including a high level voltage and a low level voltage, wherein the power rail generation circuit adaptively adjusts the power rail, so that the dimming input signal is between the high level voltage and the low level voltage; and an amplification circuit, which is configured to operably receive the dimming input signal, to generate the dimming buffer signal;

wherein the power rail is configured to operably supply electrical power to the amplification circuit, and wherein the amplification circuit operates within a range between the high level voltage and the low level voltage, wherein the high level voltage is not higher than the internal supply voltage, whereas, the low level voltage is not higher than the ground voltage level, wherein a voltage difference between the high level voltage and the low level voltage is a voltage drop of the power rail.

26. The buffer stage circuit of claim 25, wherein a voltage range of the dimming input signal is broader than a withstandable voltage range of the amplification circuit, and wherein the voltage drop of the power rail is not greater than the withstandable voltage range.

27. The buffer stage circuit of claim 25, wherein the power rail generation circuit includes:

a level shift up circuit, which is configured to operably and adaptively level shift up the dimming input signal, to generate the high level voltage, wherein the high level voltage is higher than the dimming input signal by a predetermined level shift up level; and a level shift down circuit, which is configured to operably and adaptively level shift down the dimming input signal, to generate the low level voltage, wherein the low level voltage is lower than the dimming input signal by a predetermined level shift down level.

28. The buffer stage circuit of claim 27, wherein the power rail generation circuit further includes:

a clamp circuit coupled to the level shift up circuit, wherein when the high level voltage drops to an internal voltage, the clamp circuit is configured to operably clamp the high level voltage to the internal voltage, thus ensuring the high level voltage to be not lower than the internal voltage.

29. The buffer stage circuit of claim 27, wherein the power rail generation circuit further includes:

a pull down circuit coupled to the level shift down circuit, wherein when the high level voltage or the low level voltage drops to a setting voltage, the pull down circuit is configured to operably pull down the low level voltage to the ground voltage level, thus ensuring the low level voltage to remain at the ground voltage under a situation where the high level voltage or the low level voltage is not higher than the setting voltage.

30. The buffer stage circuit of claim 25, wherein the amplification circuit includes an operational amplifier;

wherein the high level voltage functions as a positive operation voltage of the operational amplifier, whereas, the low level voltage functions as a negative operation voltage of the operational amplifier;

wherein a positive terminal of the operational amplifier receives the dimming input signal, and wherein a negative terminal of the operational amplifier is electrically connected to an output terminal of the operational amplifier, to form a unit gain buffer.

31. The buffer stage circuit of claim 27, wherein the level shift up circuit includes:
a level shift up current source, which is configured to operably supply a level shift up current; and
a level shift up diode group including one or a plurality of diode structures which are forward connected in series, wherein the level shift up diode group has an input terminal, which is configured to operably receive the dimming input signal, and wherein the level shift up current flows from a forward terminal of the level shift up diode group, through the level shift up diode group, to a backward terminal of the level shift up diode group, to adaptively level shift up the dimming input signal, thus generating the high level voltage.

32. The buffer stage circuit of claim 31, wherein the level shift down circuit includes a level shift down Zener diode, which is coupled between the high level voltage and the low level voltage, wherein the level shift down Zener diode is configured to operably ensure the voltage drop of the power rail to remain at a level shift down Zener voltage.

33. The buffer stage circuit of claim 31, wherein the diode structure includes a MOS device, wherein a gate of the MOS device is electrically connected to a drain of the MOS device.

34. The buffer stage circuit of claim 31, wherein the level shift up diode group includes a level shift up source follower, wherein a gate of the level shift up source follower functions as the input terminal for receiving the dimming input signal.

35. The buffer stage circuit of claim 27, wherein the level shift down circuit includes:
a level shift down current source, which is configured to operably supply a level shift down current; and
a level shift down diode group including one or a plurality of diode structures which are forward connected in series, wherein the level shift down diode group has an input terminal, which is configured to operably receive the dimming input signal, and wherein the level shift down current flows from a forward terminal of the level shift down diode group, through the level shift down diode group, to a backward terminal of the level shift down diode group, to adaptively level shift down the dimming input signal, thus generating the low level voltage.

36. The buffer stage circuit of claim 30, wherein the level shift down circuit includes:
a level shift down current source, which is configured to operably supply a level shift down current; and
a level shift down diode group including one or a plurality of diode structures which are forward connected in series, wherein the level shift down diode group has an input terminal, which is configured to operably receive the dimming input signal, and wherein the level shift down current f flows from a forward terminal of the level shift down diode group, through the level shift down diode group, to a backward terminal of the level shift down diode group, to adaptively level shift down the dimming input signal, thus generating the low level voltage.

37. The buffer stage circuit of claim 35, wherein the level shift up circuit includes a level shift up Zener diode, which is coupled between the high level voltage and the low level voltage, wherein the level shift up Zener diode is configured to operably ensure the voltage drop of the power rail to remain at a level shift up Zener voltage.

38. The buffer stage circuit of claim 36, wherein the level shift up circuit includes a level shift up Zener diode, which is coupled between the high level voltage and the low level voltage, wherein the level shift up Zener diode is configured to operably ensure the voltage drop of the power rail to remain at a level shift up Zener voltage.

39. The buffer stage circuit of claim 35, wherein the diode structure includes a MOS device, wherein a gate of the MOS device is electrically connected to a drain of the MOS device.

40. The buffer stage circuit of claim 36, wherein the diode structure includes a MOS device, wherein a gate of the MOS device is electrically connected to a drain of the MOS device.

41. The buffer stage circuit of claim 35, wherein the level shift down diode group includes a level shift down source follower, wherein a gate of the level shift down source follower functions as the input terminal for receiving the dimming input signal.

42. The buffer stage circuit of claim 36, wherein the level shift down diode group includes a level shift down source follower, wherein a gate of the level shift down source follower functions as the input terminal for receiving the dimming input signal.

43. The buffer stage circuit of claim 27, wherein the level shift up circuit includes:
a level shift up current source, which is configured to operably supply a level shift up current;
a level shift up resistor, which is coupled to the level shift up current source and which is configured to operably receive the level shift up current; and
a level shift up source follower coupled to the level shift up resistor, wherein an input terminal of the level shift up source follower is configured to operably receive the dimming input signal, and wherein an output terminal of the level shift up source follower is electrically connected to the level shift up resistor;
wherein the level shift up current flows through the level shift up resistor and the level shift up source follower, to adaptively level shift up the dimming input signal, thus generating the high level voltage.

44. The buffer stage circuit of claim 30, wherein the level shift up circuit includes:
a level shift up current source, which is configured to operably supply a level shift up current;
a level shift up resistor, which is coupled to the level shift up current source and which is configured to operably receive the level shift up current; and
a level shift up source follower coupled to the level shift up resistor, wherein an input terminal of the level shift up source follower is configured to operably receive the dimming input signal, and wherein an output terminal of the level shift up source follower is electrically connected to the level shift up resistor;
wherein the level shift up current flows through the level shift up resistor and the level shift up source follower, to adaptively level shift up the dimming input signal, thus generating the high level voltage.

45. The buffer stage circuit of claim 43, wherein the level shift down circuit includes a level shift down Zener diode, which is coupled between the high level voltage and the low level voltage, wherein the level shift down Zener diode is configured to operably ensure the voltage drop of the power rail to remain at a level shift down Zener voltage.

46. The buffer stage circuit of claim 44, wherein the level shift down circuit includes a level shift down Zener diode, which is coupled between the high level voltage and the low level voltage, wherein the level shift down Zener diode is configured to operably ensure the voltage drop of the power rail to remain at a level shift down Zener voltage.

47. The buffer stage circuit of claim 34, wherein the level shift up diode group further includes a level shift up clamp circuit coupled between the gate and a source of the level shift up source follower, wherein the level shift up clamp circuit is configured to operably ensure that a voltage difference between the gate and the source of the level shift up source follower does not exceed a level shift up clamp voltage.

48. The buffer stage circuit of claim 43, wherein the level shift up diode group further includes a level shift up clamp circuit coupled between the gate and a source of the level shift up source follower, wherein the level shift up clamp circuit is configured to operably ensure that a voltage difference between the gate and the source of the level shift up source follower does not exceed a level shift up clamp voltage.

49. The buffer stage circuit of claim 44, wherein the level shift up diode group further includes a level shift up clamp circuit coupled between the gate and a source of the level shift up source follower, wherein the level shift up clamp circuit is configured to operably ensure that a voltage difference between the gate and the source of the level shift up source follower does not exceed a level shift up clamp voltage.

* * * * *